(12) United States Patent
Pratt

(10) Patent No.: US 8,021,981 B2
(45) Date of Patent: Sep. 20, 2011

(54) REDISTRIBUTION LAYERS FOR MICROFEATURE WORKPIECES, AND ASSOCIATED SYSTEMS AND METHODS

(75) Inventor: David Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 683 days.

(21) Appl. No.: 11/513,661

(22) Filed: Aug. 30, 2006

(65) Prior Publication Data

US 2008/0057620 A1    Mar. 6, 2008

(51) Int. Cl.
*H01L 21/44* (2006.01)
(52) U.S. Cl. .. 438/666; 438/667; 438/668; 257/E21.577
(58) Field of Classification Search .................. 438/666
See application file for complete search history.

(56) References Cited

U.S. PATENT DOCUMENTS

| | | | | |
|---|---|---|---|---|
| 5,402,992 | A * | 4/1995 | Saxena | 266/202 |
| 5,432,677 | A * | 7/1995 | Mowatt et al. | 361/719 |
| 5,646,067 | A * | 7/1997 | Gaul | 438/458 |
| 5,682,062 | A | 10/1997 | Gaul | |
| 5,786,238 | A * | 7/1998 | Pai et al. | 438/118 |
| 6,235,554 | B1 | 5/2001 | Akram et al. | |
| 6,472,293 | B1 * | 10/2002 | Suga | 438/455 |
| 6,828,175 | B2 * | 12/2004 | Wood et al. | 438/113 |
| 6,873,054 | B2 * | 3/2005 | Miyazawa et al. | 257/774 |
| 6,946,325 | B2 * | 9/2005 | Yean et al. | 438/112 |
| 6,991,966 | B2 * | 1/2006 | Tuominen | 438/118 |
| 7,083,425 | B2 | 8/2006 | Chong et al. | |
| 7,112,887 | B2 * | 9/2006 | Swan et al. | 257/777 |
| 7,271,086 | B2 | 9/2007 | Tang et al. | |
| 7,425,499 | B2 | 9/2008 | Oliver et al. | |
| 7,485,969 | B2 | 2/2009 | Corisis et al. | |
| 7,553,699 | B2 | 6/2009 | Lee | |
| 2002/0190371 | A1 * | 12/2002 | Mashino et al. | 257/690 |
| 2003/0119279 | A1 * | 6/2003 | Enquist | 438/455 |
| 2004/0178495 | A1 * | 9/2004 | Yean et al. | 257/723 |
| 2004/0214373 | A1 * | 10/2004 | Jiang et al. | 438/110 |
| 2004/0219765 | A1 * | 11/2004 | Reif et al. | 438/458 |
| 2004/0245649 | A1 * | 12/2004 | Imaoka | 257/774 |
| 2005/0046002 | A1 * | 3/2005 | Lee et al. | 257/678 |
| 2005/0104228 | A1 * | 5/2005 | Rigg et al. | 257/786 |
| 2005/0136634 | A1 * | 6/2005 | Savastiouk et al. | 438/597 |
| 2005/0140921 | A1 * | 6/2005 | Lee et al. | 349/187 |
| 2005/0275048 | A1 * | 12/2005 | Farnworth et al. | 257/431 |
| 2006/0038300 | A1 * | 2/2006 | Tanida et al. | 257/773 |
| 2006/0043535 | A1 * | 3/2006 | Hiatt | 257/621 |
| 2006/0289968 | A1 | 12/2006 | Sulfridge | |
| 2006/0290001 | A1 | 12/2006 | Sulfridge | |
| 2008/0079120 | A1 | 4/2008 | Foster et al. | |
| 2008/0081398 | A1 | 4/2008 | Lee et al. | |
| 2009/0305502 | A1 | 12/2009 | Lee et al. | |

FOREIGN PATENT DOCUMENTS

EP        1415950 A2    5/2004

* cited by examiner

*Primary Examiner* — Charles D Garber
*Assistant Examiner* — Pape Sene
(74) *Attorney, Agent, or Firm* — Perkins Coie LLP

(57) ABSTRACT

Redistribution layers for microfeature workpieces, and associated systems and methods are disclosed. One method for processing a microfeature workpiece system includes positioning a preformed redistribution layer as a unit proximate to and spaced apart from a microfeature workpiece having an operable microfeature device. The method can further include attaching the redistribution layer to the microfeature workpiece and electrically coupling the redistribution layer to the operable microfeature device.

32 Claims, 17 Drawing Sheets

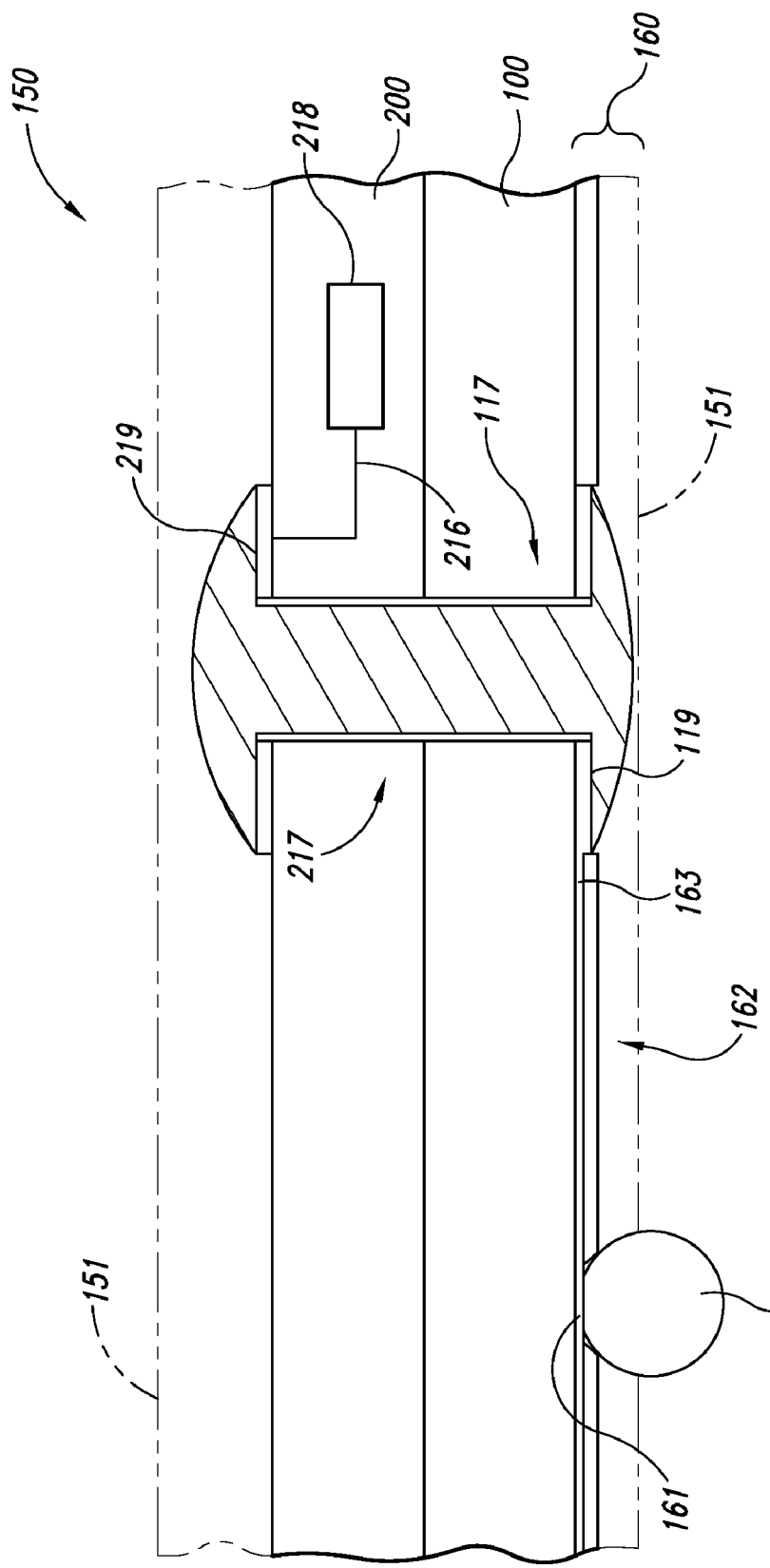

REDISTRIBUTION LAYERS FOR MICROFEATURE WORKPIECES, AND ASSOCIATED SYSTEMS AND METHODS

TECHNICAL FIELD

The present disclosure is directed to redistribution layers for microfeature workpieces, and associated systems and methods.

BACKGROUND

Microelectronic devices generally have a die (i.e., a chip) that includes integrated circuitry with a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, and etching). The dies typically include an array of very small bond-pads electrically coupled to the integrated circuitry. The bond-pads are external electrical contacts through which the supply voltage, signals, etc., are transmitted to and from the integrated circuitry. After forming the dies, the wafer is thinned by backgrinding, and then the dies are separated from one another (i.e., singulated) by dicing the wafer. Next, the dies are "packaged" to couple the bond-pads to a larger array of electrical terminals that can be more easily coupled to the various power supply lines, signal lines, and ground lines. Conventional processes for packaging dies include electrically coupling the bond-pads on the dies to an array of leads, ball-pads, or other types of electrical terminals, and then encapsulating the dies to protect them from environmental factors (e.g., moisture, particulates, static electricity, and physical impact).

Different types of dies may have widely different bond pad arrangements, and yet should be compatible with similar external devices. Accordingly, existing packaging techniques can include forming a redistribution layer (RDL) on the die. The RDL includes lines and/or vias that connect the die bond pads with RDL bond pads, which are in turn arranged to mate with the bond pads of external devices. The RDL is typically formed directly on the die using deposition and lithography techniques.

One drawback with the foregoing RDL formation technique is that it may not be an economical process for certain types of dies. For example, imager dies typically include image sensors on the front side of the die and bond pads positioned on the back side of the die, so that connections to the bond pads do not interfere with the operation of the image sensors. However, the lithography techniques and other conventional semiconductor processes employed for forming RDLs are typically performed on the front side of the die, and adjusting these techniques to provide for the proper alignment of features on the back side of the die can require special tooling and/or techniques that increase the cost of forming the RDL. Accordingly, there is a need for lower cost RDL formation techniques that may be applicable to a wide variety of die types.

BRIEF DESCRIPTION OF THE DRAWINGS

FIG. 1D is a partially schematic, cross-sectional illustration of a portion of a workpiece package after the formation of conductive structures, including a redistribution layer, in accordance with an embodiment of the invention.

DETAILED DESCRIPTION

Figure 1A:
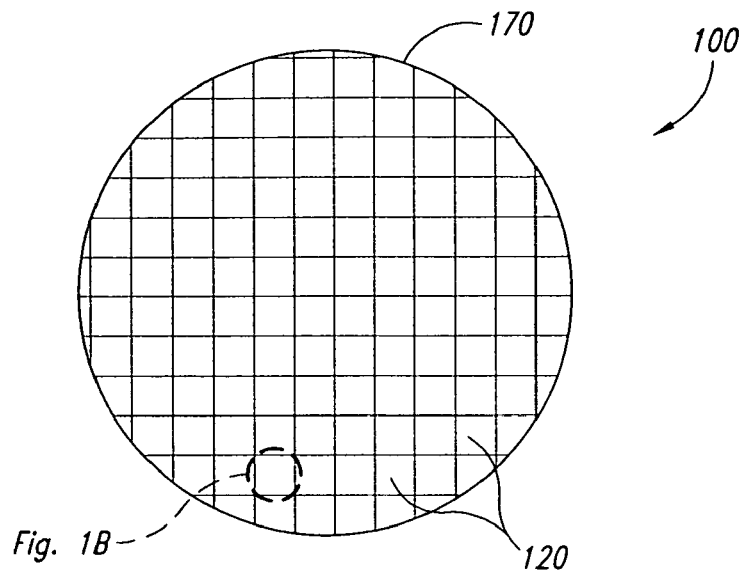
FIG. 1A is a partially schematic illustration of a representative microfeature workpiece carrying microfeature dies configured in accordance with embodiments of the invention.

FIG. 1A is a microfeature workpiece 100 in the form of a wafer 170 that includes multiple microfeature dies 120. At least some of the processes described below may be conducted on the microfeature workpiece 100 at the wafer level, and other processes may be conducted on the individual microfeature dies 120 of the microfeature workpiece 100 after the dies 120 have been singulated from the larger wafer 170. Accordingly, unless otherwise noted, structures and methods described below in the context of a "microfeature workpiece" can apply to the wafer 170 and/or the dies 120 that are formed from the wafer 170.

As used herein, the terms "microfeature workpiece" and "workpiece" refer to substrates in and/or on which microelectronic devices are integrally formed. Typical microelectronic devices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. Substrates can be semiconductive pieces (e.g., doped silicon wafers or gallium arsenide wafers), non-conductive pieces (e.g., various ceramic substrates), or conductive pieces. In some cases, the workpieces are generally round, and in other cases, the workpieces have other shapes, including rectilinear shapes.

Figure 1B:
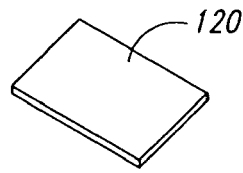
FIG. 1B is a schematic illustration of a microfeature die singulated from the workpiece shown in FIG. 1A.

FIG. 1B is a schematic illustration of an individual die 120 after it has been singulated from the wafer 170 shown in FIG. 1A. The die 120 can include operable microelectronic structures, optionally encased within a protective encapsulant. Pins, bond pads, solder balls, and/or other conductive structures provide electrical communication between structures within the die 120 and structures/devices located external to the die.

Figure 1C:
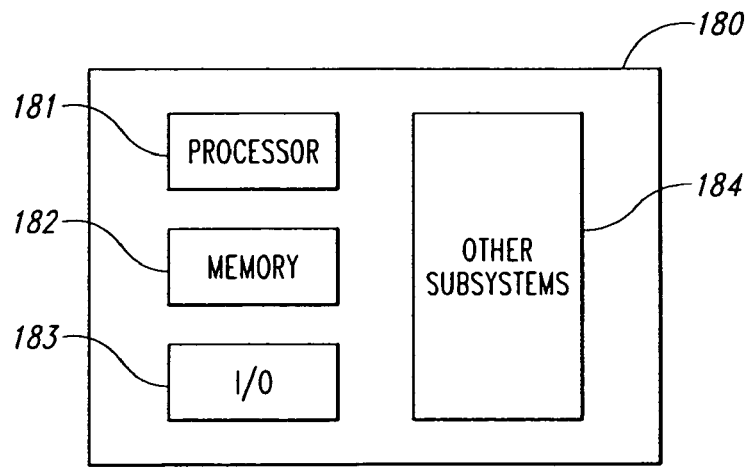
FIG. 1C is a schematic illustration of a system that can include one or more microfeature dies in accordance with embodiments of the invention.

Individual dies may be incorporated into any of a myriad of larger and/or more complex systems 180, a representative one of which is shown schematically in FIG. 1C. The system 180 can include a processor 181, a memory 182, input/output devices 183, and/or other subsystems or components 184. Microfeature workpieces (e.g., in the form of microfeature dies and/or combinations of microfeature dies) may be included in any of the components shown in FIG. 1C. The resulting system 180 can perform any of a wide variety of computing, processing, storage, sensor and/or other functions. Accordingly, representative systems 180 include, without limitation, computers and/or other data processors, for example, desktop computers, laptop computers, Internet appliances, hand-held devices (e.g., palm-top computers, wearable computers, cellular or mobile phones, multi-processor systems, processor-based or programmable consumer electronics, network computers, mini computers). Other representative systems 180 include cameras, light sensors, servers and associated server subsystems, display devices, and/or memory devices. Components of the system 180 may be housed in a single unit or distributed over multiple, interconnected units, e.g., through a communications network. Components can accordingly include local and/or remote memory storage devices, and any of a wide variety of computer-readable media, including magnetic or optically readable or removable computer disks.

Several embodiments of microfeature workpieces having redistribution layers (RDLs) and associated methods are described below. In particular embodiments, the RDL is formed in a separate microfeature workpiece, which is then attached to a microfeature workpiece having operable microfeature devices. A person skilled in the relevant art will understand, however, that the invention may have additional embodiments, and that the invention may be practical without several of the details of the embodiments described below with reference to FIGS. 1D-4.

FIG. 1D is a partially schematic, side elevation view of a package 150 formed from a first microfeature workpiece 100 and a second microfeature workpiece 200, in accordance with an embodiment of the invention. Many components shown in FIG. 1D are shown schematically for purposes of illustration. These components (and others) are shown and described in greater detail later with reference to additional Figures. In the illustrated embodiment, the second microfeature workpiece 200 includes an operable microfeature device 218, while the first microfeature workpiece 100 does not. Instead, the first microfeature workpiece 100 includes a redistribution layer (RDL) 160 that is configured to reroute signals to and/or from the second microfeature workpiece 200. Accordingly, the first microfeature workpiece 100 can include a first bond site 119, and a conductive structure 162 connected to the first bond site 119. The conductive structure 162 can include a lateral line 163 connected to an RDL bond site 161 that is laterally offset from the first bond site 119. The RDL bond site 161 can support a conductive coupler 152 (e.g., a solder ball) that provides electrical communication with external devices.

The first microfeature workpiece 100 can include a first interconnect structure 117 that is connected to a corresponding second interconnect structure 217 of the second microfeature workpiece 200. The second interconnect structure 217 is connected to a second bond site 219, that is in turn connected to the microfeature device 218 by a conductive line 216. An optional covering 151 (e.g., a mold compound or underfill material) can be disposed over the first and second bond sites 119, 219, leaving the RDL (or third) bond site 161 exposed. In other embodiments, one or both of the first and second bond sites 119, 219 can be exposed for connections to other structures, including but not limited to stacked microfeature workpieces.

The first microfeature workpiece 100 and the second microfeature workpiece 200 can be processed independently (e.g., in parallel or sequentially) and can then be attached to each other to provide for redistribution of electrical signals received from and delivered to the second microfeature workpiece 200. Accordingly, the first microfeature workpiece 100 need not include any operable microfeature devices. As will be discussed in greater detail below, this can provide the manufacturer with increased flexibility when selecting processes for forming the redistribution layer 160.

Further details of the formation of the second microfeature workpiece 200, which includes at least one operable microfeature device 218, are described below with reference to FIGS. 2A-L. Further details of the formation of the first microfeature workpiece 100, which includes the RDL 160, are described below with reference to FIGS. 3A-3C. Representative processes for attaching the microfeature workpieces 100, 200 are then described with reference to FIG. 4.

Figure 2A:
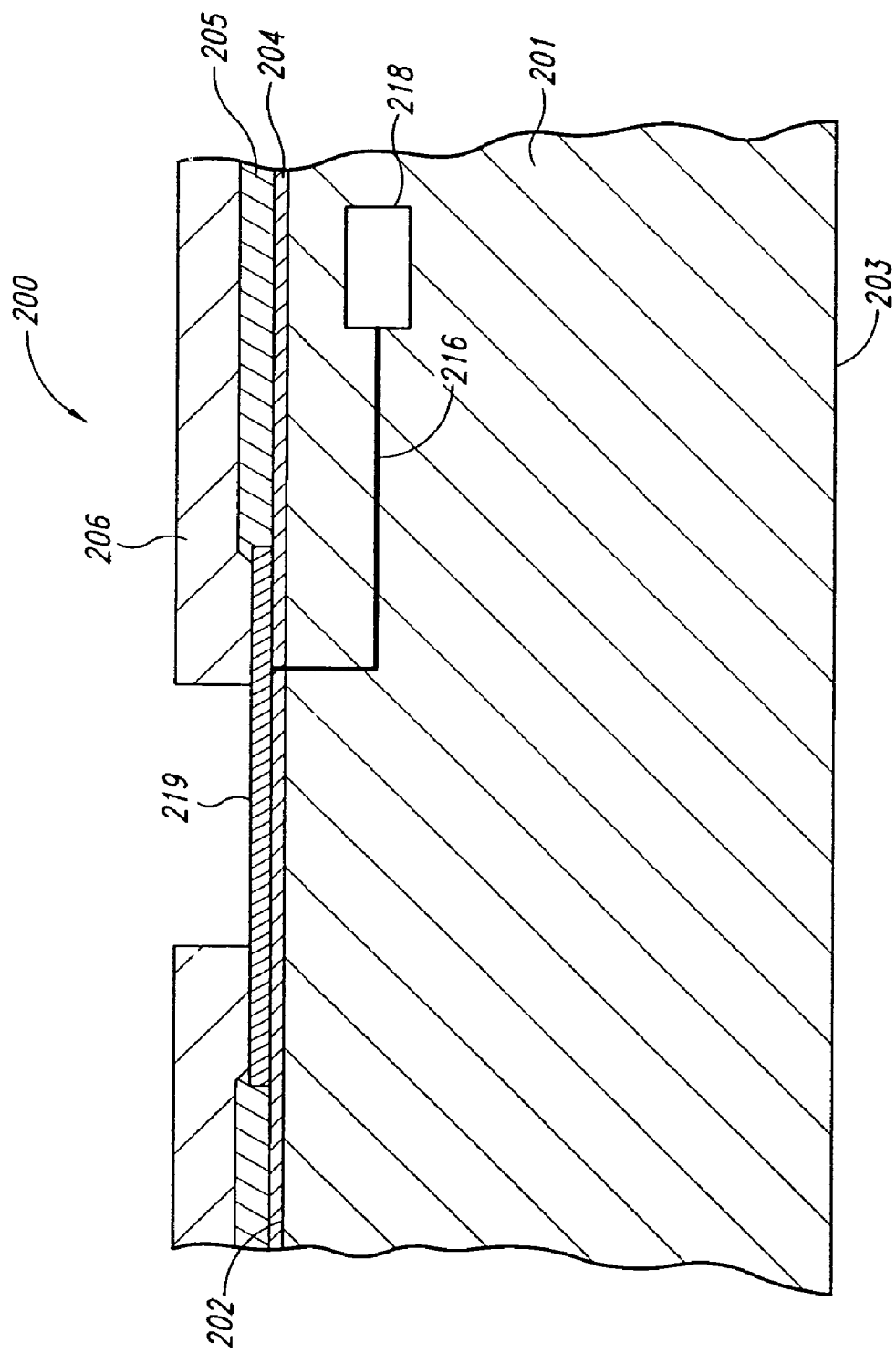
FIGS. 2A-2L illustrate a process for forming a conductive via used to electrically couple a microfeature workpiece to a redistribution layer in accordance with an embodiment of the invention.

FIG. 2A is a side cross-sectional view of a portion of the second workpiece 200 prior to the formation of a conductive interconnect structure in accordance with an embodiment of the invention. The workpiece 200 can include a substrate 201 having a first side or surface 202 and a second side or surface 203. An integrated circuit or other operable microfeature device 218 is formed in and/or on the substrate 201, e.g., at or near the first side 202. As used herein, the term "operable microfeature device" refers generally to a device that has a function beyond that of a simple conductor. Such devices can accordingly include integrated circuits, capacitors, and/or sensing elements, but do not include bond pads, conductive lines, or vias.

The operable microfeature device 218 is coupled to the second bond site 219 (which can include a bond pad or other terminal) with a coupler 216. The second bond site 219 shown in FIG. 2A is an external feature at the first side 202 of the substrate 201. In other embodiments, however, the second bond site 219 can be an internal feature that is embedded at an intermediate depth within the substrate 201.

First and second dielectric layers 204 and 205 (e.g., passivation layers or other insulating layers) can be located at the first side 202 to protect the underlying substrate 201. As shown in FIG. 2A, the second dielectric layer 205 has been patterned and etched to expose the second bond site 219. A mask 206 is applied over the second dielectric layer 205 and patterned. The mask 206 can be a layer of resist that is patterned according to the arrangement of second bond sites 219 on the substrate 201. Accordingly, the mask 206 can have an opening over each second bond site 219.

Figure 2B:
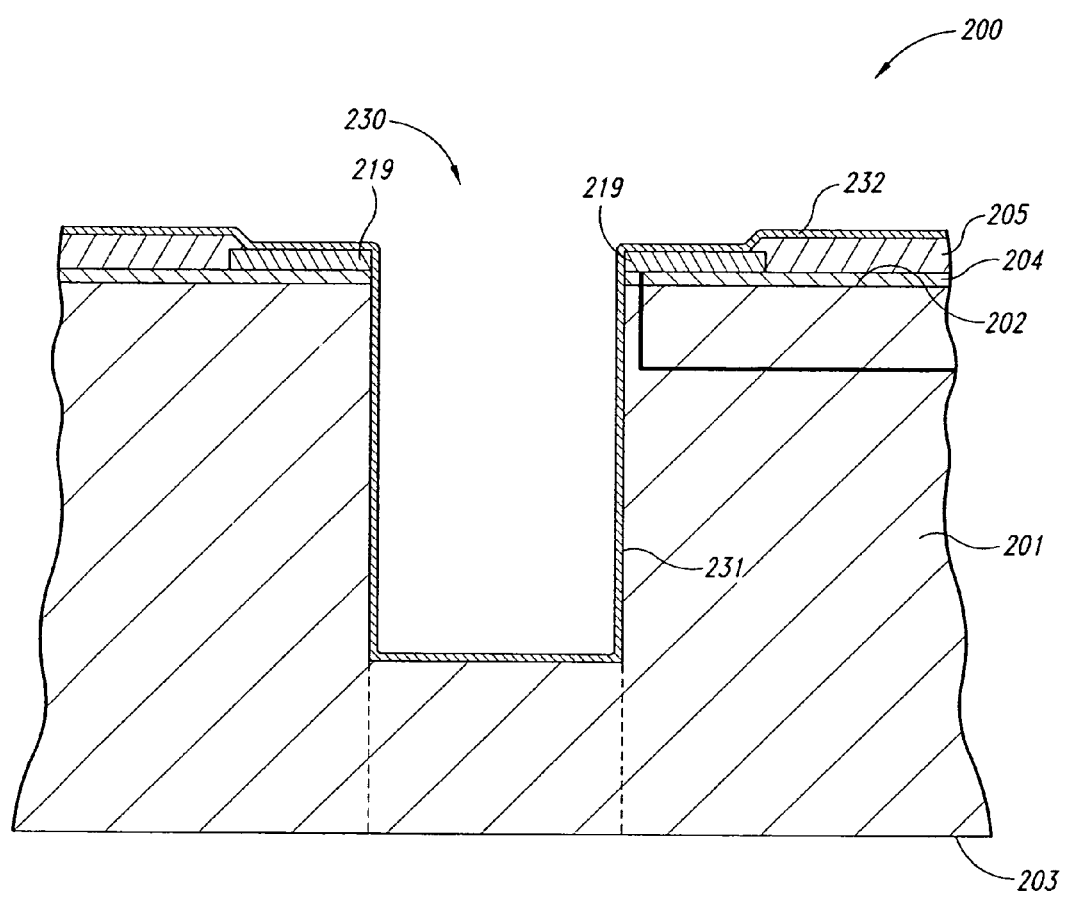

Referring next to FIG. 2B, a via 230 has been formed in the workpiece 200 so as to extend along a generally straight axis into the substrate 201 through the second bond site 219 and the first surface 202. The via 230 can be formed using any of a variety of techniques, including etching or laser drilling. The via 230 can be a blind via, as shown in FIG. 2B, e.g., a via that does not extend entirely through the workpiece 200 and/or the substrate 201. In other embodiments, the via 230 can extend entirely through the workpiece 200 and/or the substrate 201, as indicated by dashed lines in FIG. 2B. Further details of representative methods for forming the via 230 are disclosed in pending U.S. patent application Ser. No. 11/169,546, filed Jun. 28, 2005 and incorporated herein by reference. A third dielectric layer 232 (e.g., a passivation layer or other insulating layer) is deposited onto the workpiece 200 to line the sidewalls 231 of the via 230 within the substrate 201. The third dielectric layer 232 electrically insulates components in the substrate 201 from an interconnect structure that is subsequently formed in the via 230.

Figure 2C:
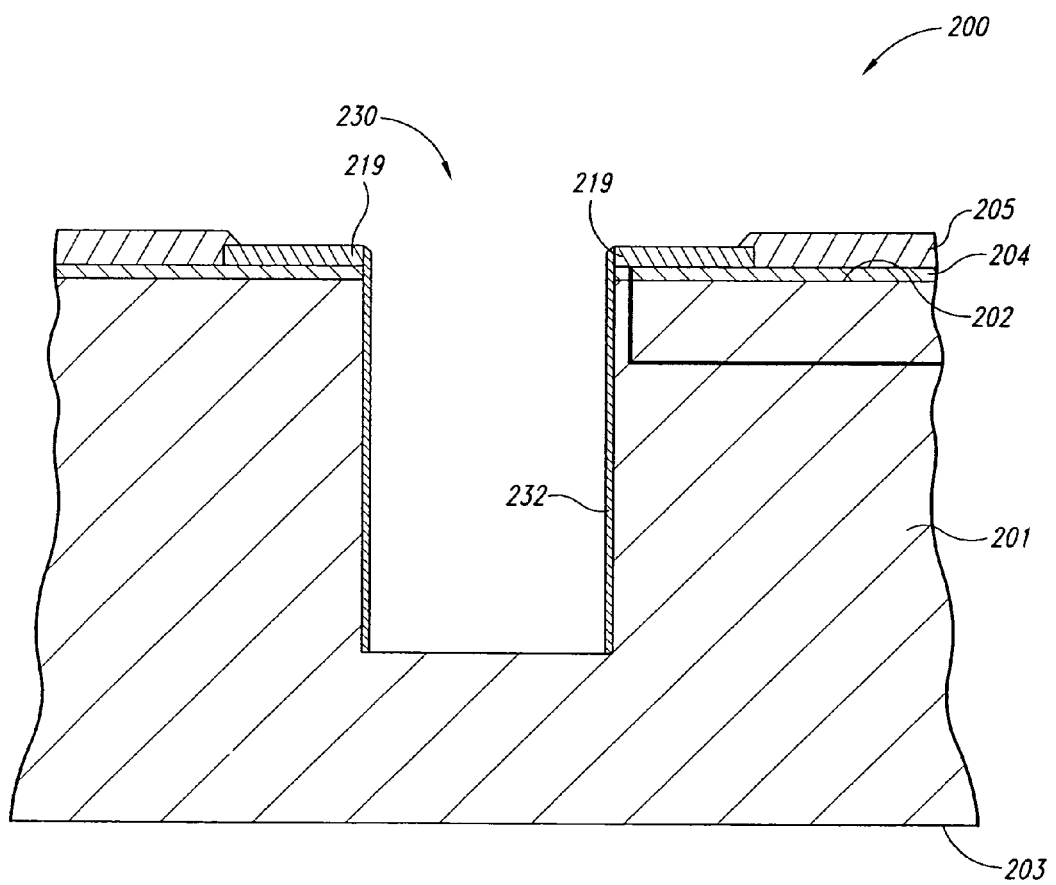

Referring to FIG. 2C, a suitable etching process (e.g., a spacer etch) is used to remove the third dielectric layer 232 at all horizontal positions while leaving it intact at all vertical positions, e.g., along the via sidewall. Accordingly, at least part of the second bond site 219 can be exposed for electrical coupling to conductive structures in the via 230, as is described in greater detail below.

Figure 2D:
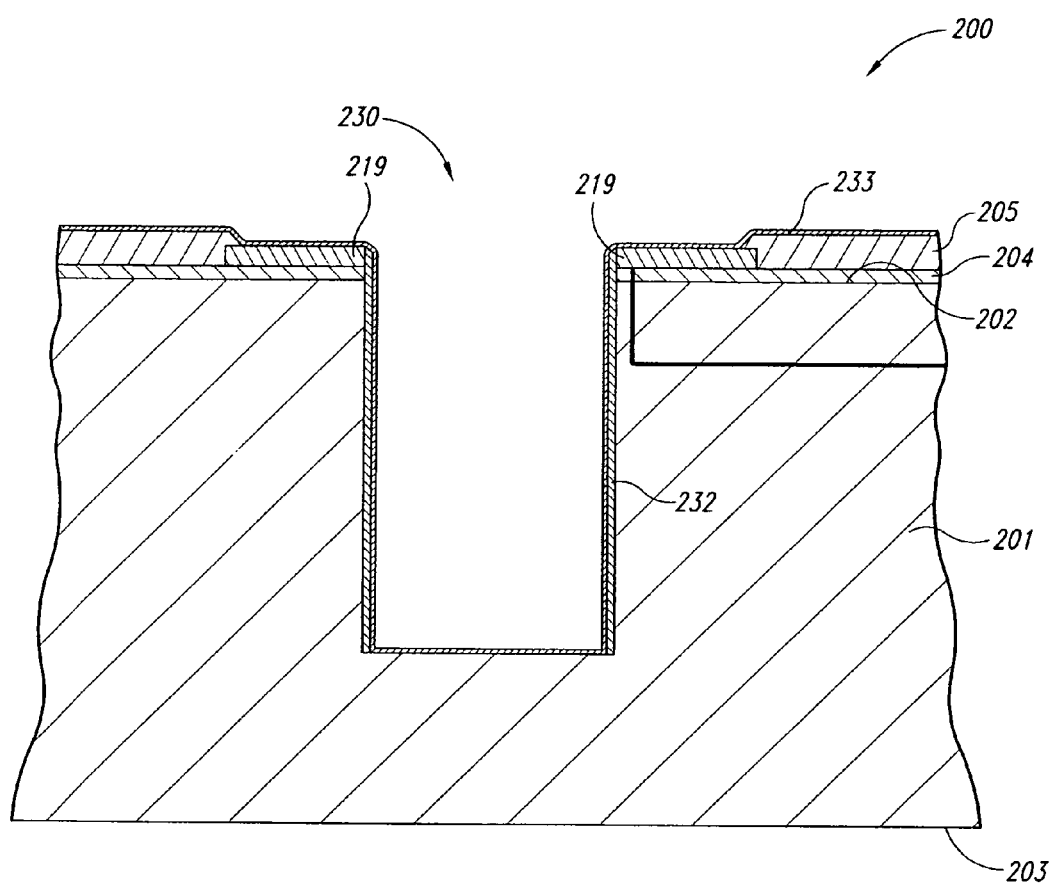

FIG. 2D illustrates the second workpiece 200 after a conductive barrier layer 233 has been deposited over the third dielectric layer 232 so as to be in electrical contact with the second bond site 219. The barrier layer 233 generally covers the second dielectric layer 205 and the second bond site 219 in addition to the third dielectric layer 232. In one embodiment, for example, the barrier layer 233 is a layer of tantalum that is deposited onto the second workpiece 200 using a physical vapor deposition (PVD) process. The thickness of the barrier layer 233 can be about 150 Angstroms. In other embodiments, the barrier layer 233 may be deposited onto the second workpiece 200 using other vapor deposition processes, such as chemical vapor deposition (CVD), and/or may have a different thickness. The composition of the barrier layer 233 is not limited to tantalum, but rather may be composed of tungsten or other suitable materials.

Figure 2E:
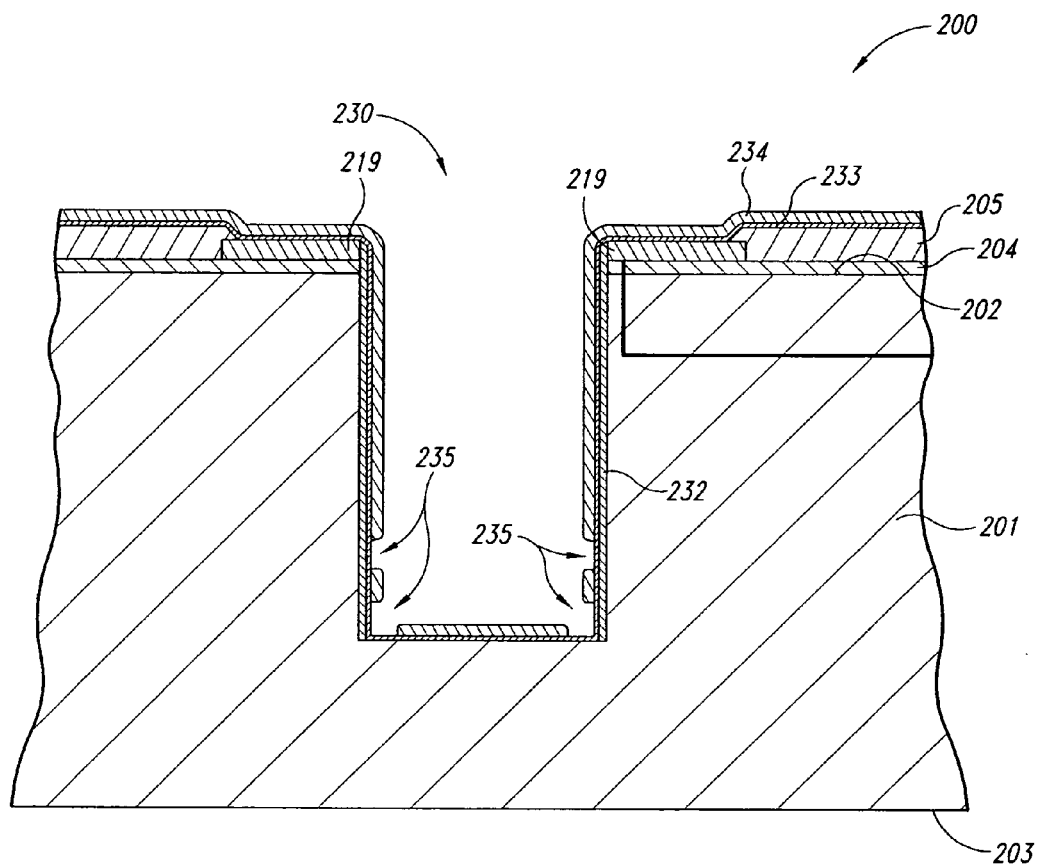
Figure 2F:
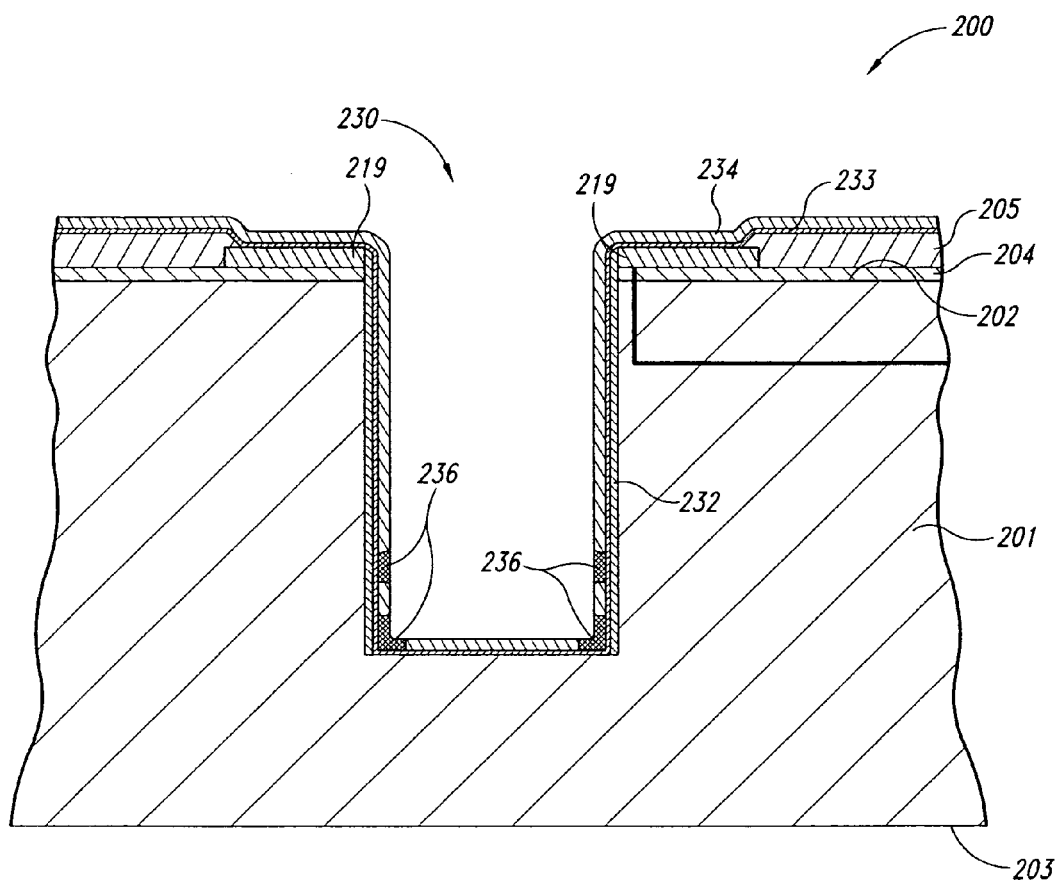

Referring next to FIG. 2E, a seed layer 234 is deposited onto the barrier layer 233. The seed layer 234 can be deposited using vapor deposition techniques, such as PVD, CVD, atomic layer deposition, and/or plating. The seed layer 234 can be composed of copper or other suitable materials. The thickness of the seed layer 234 may be about 2000 Angstroms, but can be more or less depending upon the depth and aspect ratio of the via 230. In several embodiments, the seed layer 234 may not uniformly cover the barrier layer 233, such that the seed layer 234 has voids 235 within the via 230. This can cause non-uniform electroplating in the via 230 and across the workpiece 200. When the seed layer 234 is deficient, it may be enhanced using a process that fills voids or noncontinuous regions of the seed layer 234 to form a more uniform seed layer. Referring to FIG. 2F, for example, voids 235 and/or noncontinuous regions of the seed layer 234 have been filled with additional material 236, such as copper or another suitable material. One suitable seed layer enhancement process is described in U.S. Pat. No. 6,197,181, which is incorporated by reference.

Figure 2G:
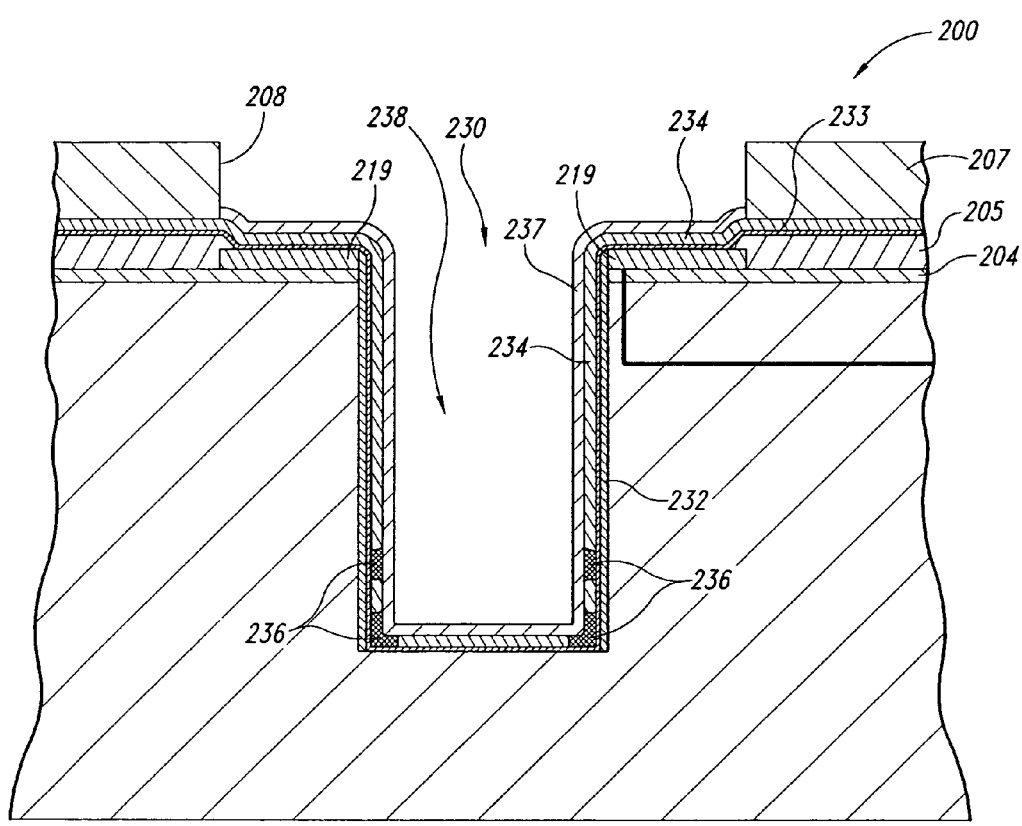

Referring next to FIG. 2G, a resist layer 207 is deposited onto the seed layer 234 and is patterned to have an opening 208 over the second bond site 219 and the via 230. A conductive lining or layer 237 is then deposited onto the exposed portions of the seed layer 234 in the via 230. The conductive lining 237 can include copper that is deposited onto the seed layer 234 in an electroless plating operation, or an electroplating operation, or by another suitable method. Optionally, the conductive lining 237 can be formed from multiple overlaid layers, but for purposes of illustration, a single layer is shown in FIG. 2G. After the conductive lining 237 has been formed, a central opening 238 typically remains in the via 230.

Figure 2H:
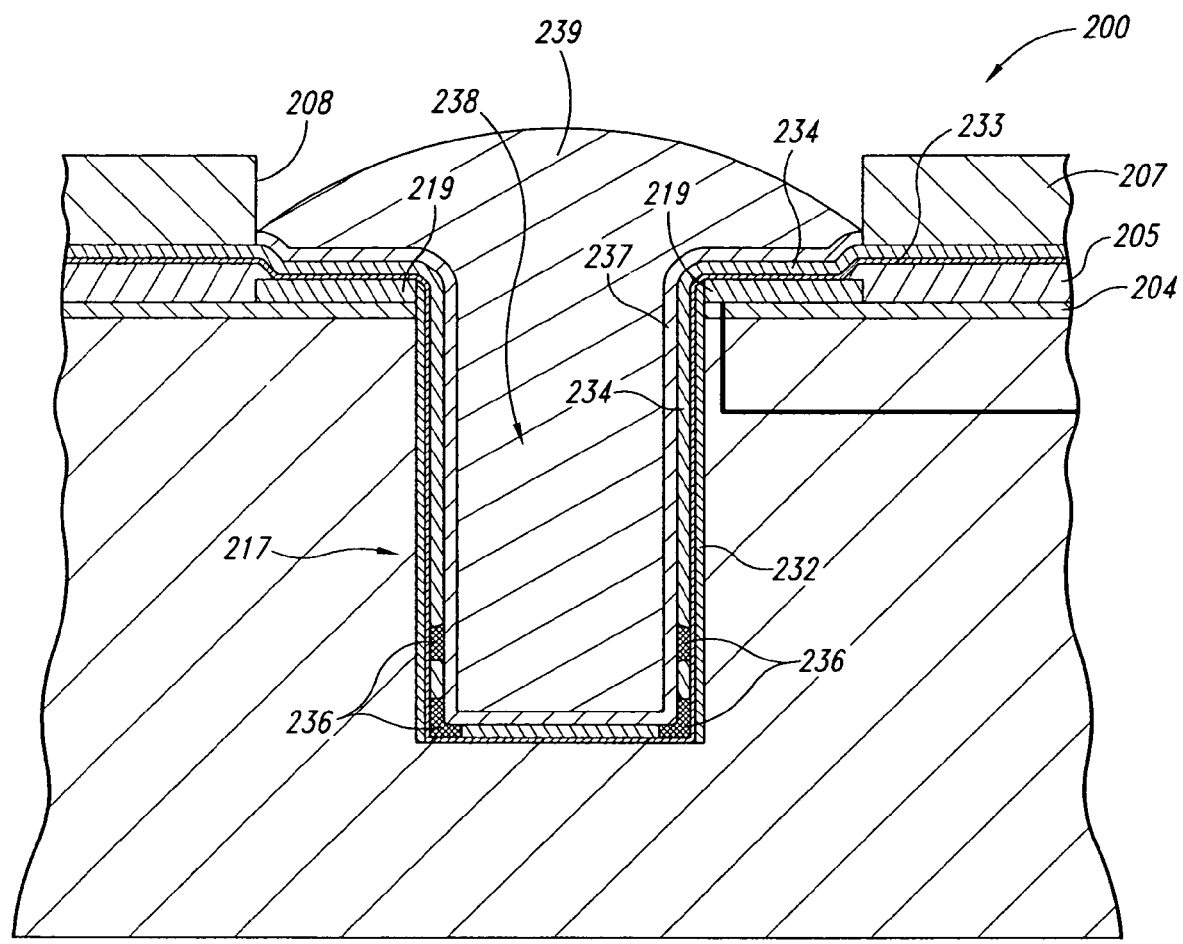

FIG. 2H illustrates the second microfeature workpiece 200 after a fill material 239 has been introduced into the opening 238. The fill material 239 can include solder or an electrically conductive polymer in one embodiment and/or other constituents in other embodiments. In particular embodiments, the fill material 239 can be less conductive than the conductive liner 237. For example, in some embodiments, the fill material 239 need not be electrically conductive at all, if other constituents in the via 230 are sufficiently conductive. Accordingly, in any of these embodiments, one or more of the fill material 239 and other materials in the via 230 (e.g., the barrier layer 233, the seed layer 234, and the conductive lining 237) form the electrically conductive second interconnect structure 217.

Figure 2I:
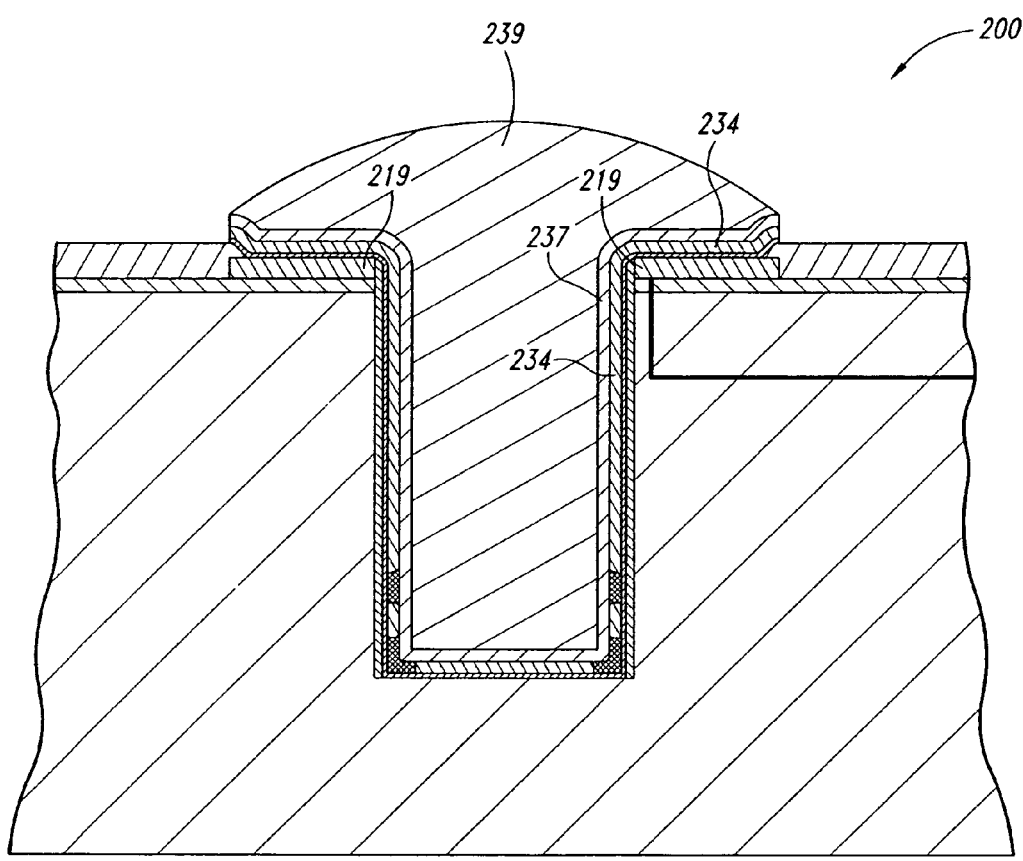
Figure 2J:
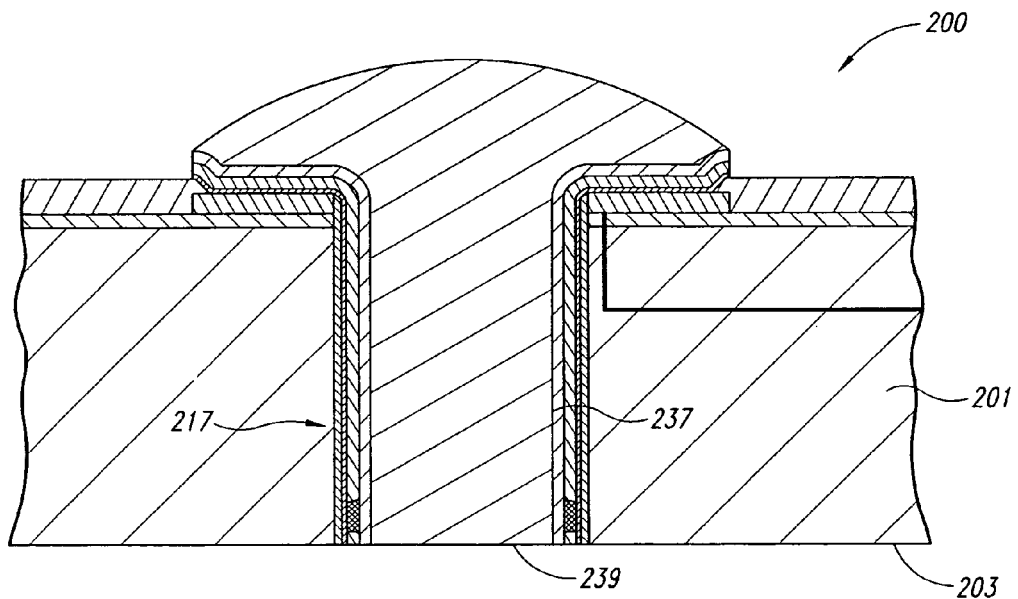

In FIG. 2I, the resist layer 207 shown in FIG. 2H has been removed from the second microfeature workpiece 200. Alternatively, the resist layer 207 can be removed prior to introducing the fill material. In FIG. 2J, the second surface 203 of the second microfeature workpiece 200 has been ground back to expose the end of the second interconnect structure 217. In the illustrated embodiment, sufficient material is removed from the second surface 203 to expose the fill material 239 within the via 230. In other embodiments, less material can be removed, so that the conductive lining 237, or other conductive constituents toward the bottom of the via 230 are exposed. In addition to exposing conductive materials in the via 230, backgrinding also reduces the overall thickness of the second microfeature workpiece 200. For example, the second microfeature workpiece 200 can have a thickness of about 50-60μ (or more or less) after backgrinding.

Figure 2K:
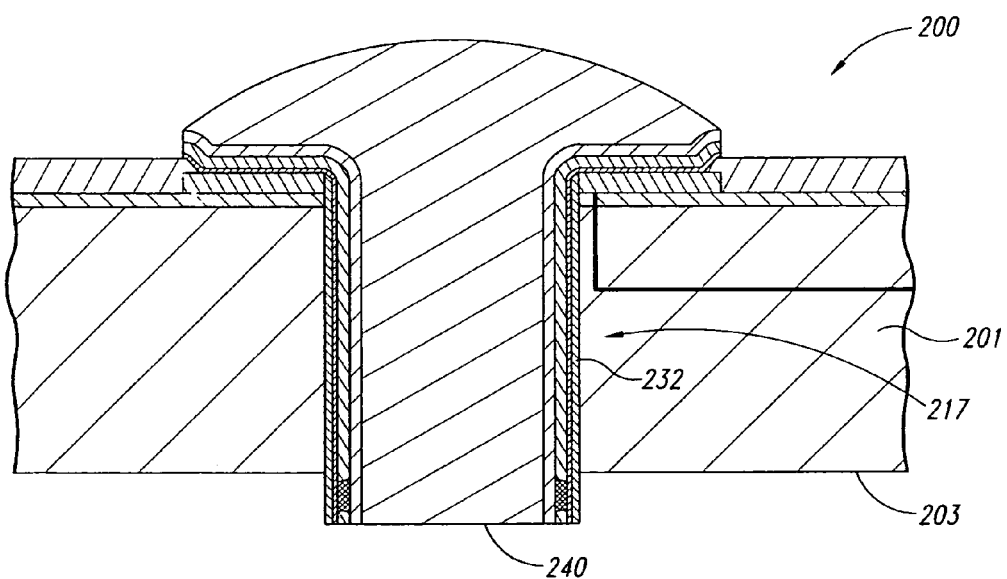

As shown in FIG. 2K, additional material may be removed from the second surface 203 of the substrate material 201, without removing corresponding material from the interconnect structure 217. For example, a plasma etchback process can be used to remove only the substrate material 201. As a result, the interconnect structure 217 can include a protrusion or stud 240 that extends beyond the second surface 203 of the substrate 201. In particular embodiments, the protrusion 240 can extend 5-15μ beyond the surrounding second surface 203 and in other embodiments, this distance can be different. The protrusion 240 can form a connection region that facilitates an electrical connection with the corresponding interconnect structure of the first microfeature workpiece 100 (FIG. 1D), as is discussed in further detail later with reference to FIG. 4.

Figure 2L:
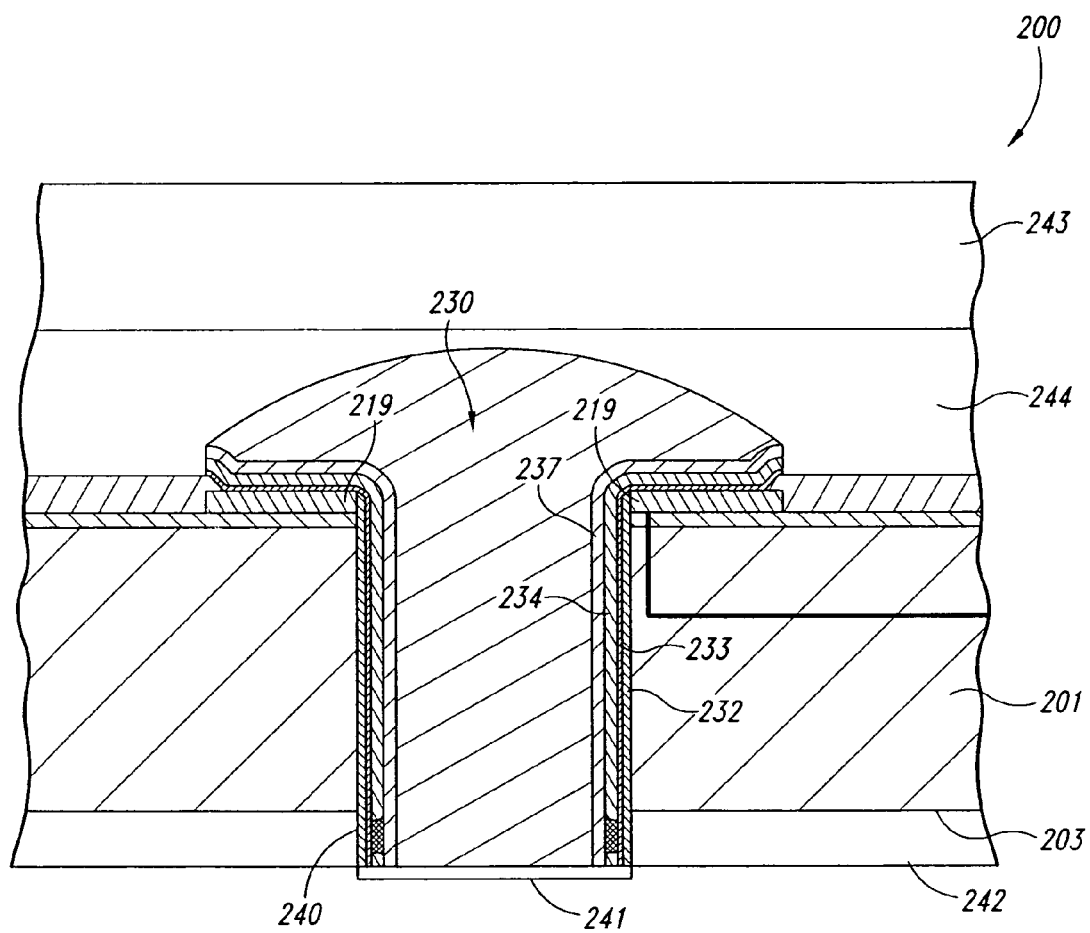

In FIG. 2L, the second workpiece 200 is prepared for being connected to the first microfeature workpiece 100 (FIG. 1D). An optional conductive cap 241 is positioned at the end of the conductive protrusion 240. The conductive cap 241 can include copper, nickel, gold or another conductive material that can facilitate electrical connectivity with the corresponding interconnect structure of the first microfeature workpiece 100. A substrate adhesive 242 is then disposed over the second surface 203 of the substrate 201. In a particular process, the substrate adhesive 242 is spun onto the substrate 201 to a depth that does not cover the protrusion 240 and the (optional) conductive cap 241. In another embodiment, a spin-on process or other process is used to dispose the substrate adhesive 242 over the cap 241, and a subsequent selective removal process is then used to remove the adhesive from the cap 241. For example, a plasma etchback process can be used to remove any overlying substrate adhesive 242. In at least some cases, it may be beneficial to avoid disposing the substrate adhesive 242 over the cap 241, to reduce the likelihood of contaminating the cap 241 with residual adhesive. Accordingly, in at least some cases, the substrate adhesive 242 can be applied with a translating x-y nozzle programmed to deposit the substrate adhesive 242 over portions of the second microfeature workpiece surface not occupied by the second interconnect structure 217. The substrate adhesive 242 will be used to form a generally permanent bond with the first microfeature workpiece 100. Accordingly, the substrate adhesive 242 can include a thermoset material (e.g., an epoxy underfill material) of other suitable long-term bonding agent.

The second microfeature workpiece 200 can optionally be supported by a carrier 243, for example, if the second microfeature workpiece 200 is thin (as it typically will be) and/or otherwise fragile. The carrier 243 can be temporarily attached to the second microfeature workpiece 200 with a carrier adhesive 244. The carrier adhesive 244 can include a thermoplastic material or other material that provides a sufficiently strong bond to allow the carrier 243 and the second microfeature workpiece 200 to be moved as a unit, but is also releasable after the second microfeature workpiece 200 has been packaged. The carrier 243 can include any of a variety of suitable devices, including a film frame, and can be attached to the second microfeature workpiece 200 after backgrinding (as shown in FIG. 2L) or before backgrinding.

Figure 3A:
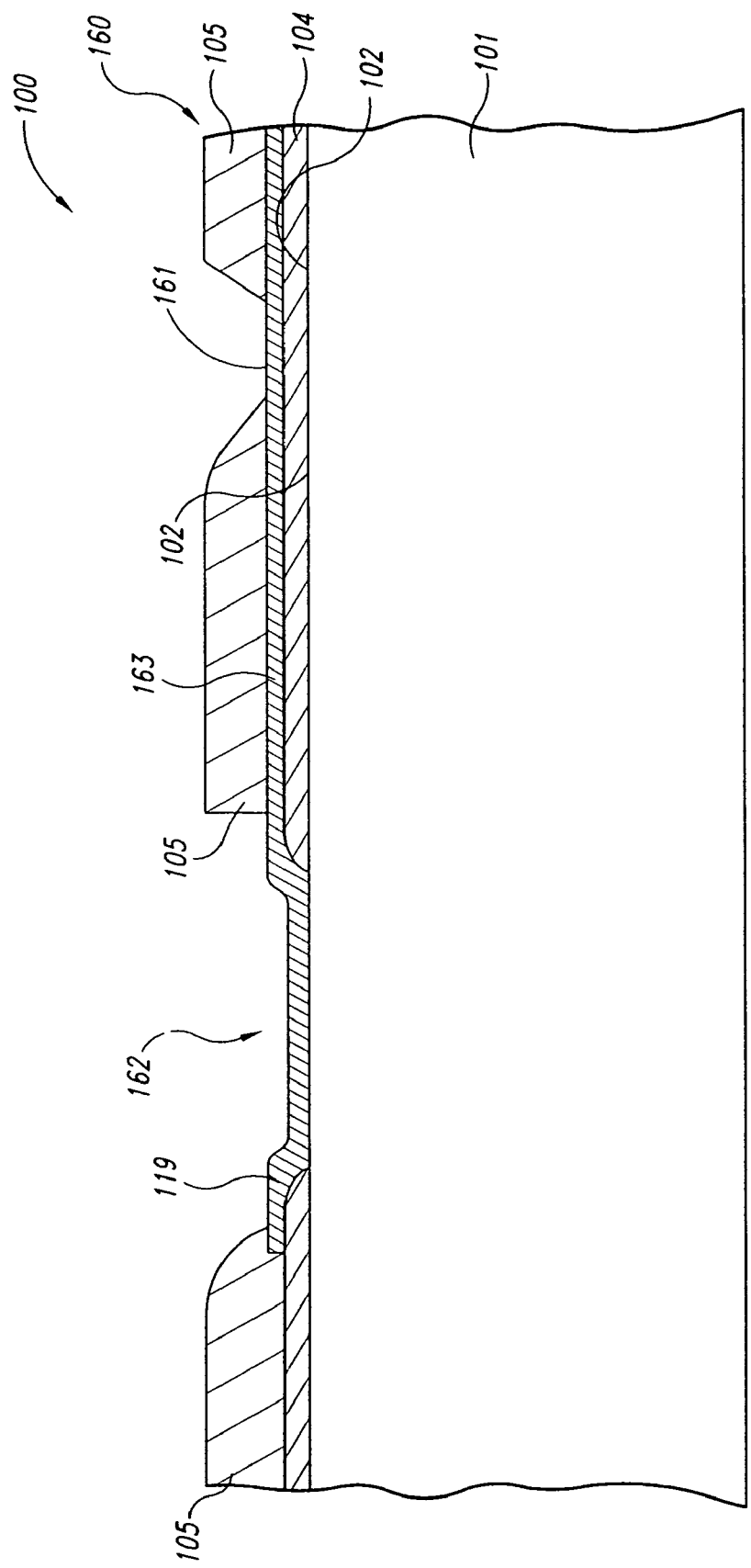
FIGS. 3A-3C illustrate a process for forming a microfeature workpiece having a redistribution layer in accordance with an embodiment of the invention.
Figure 3B:
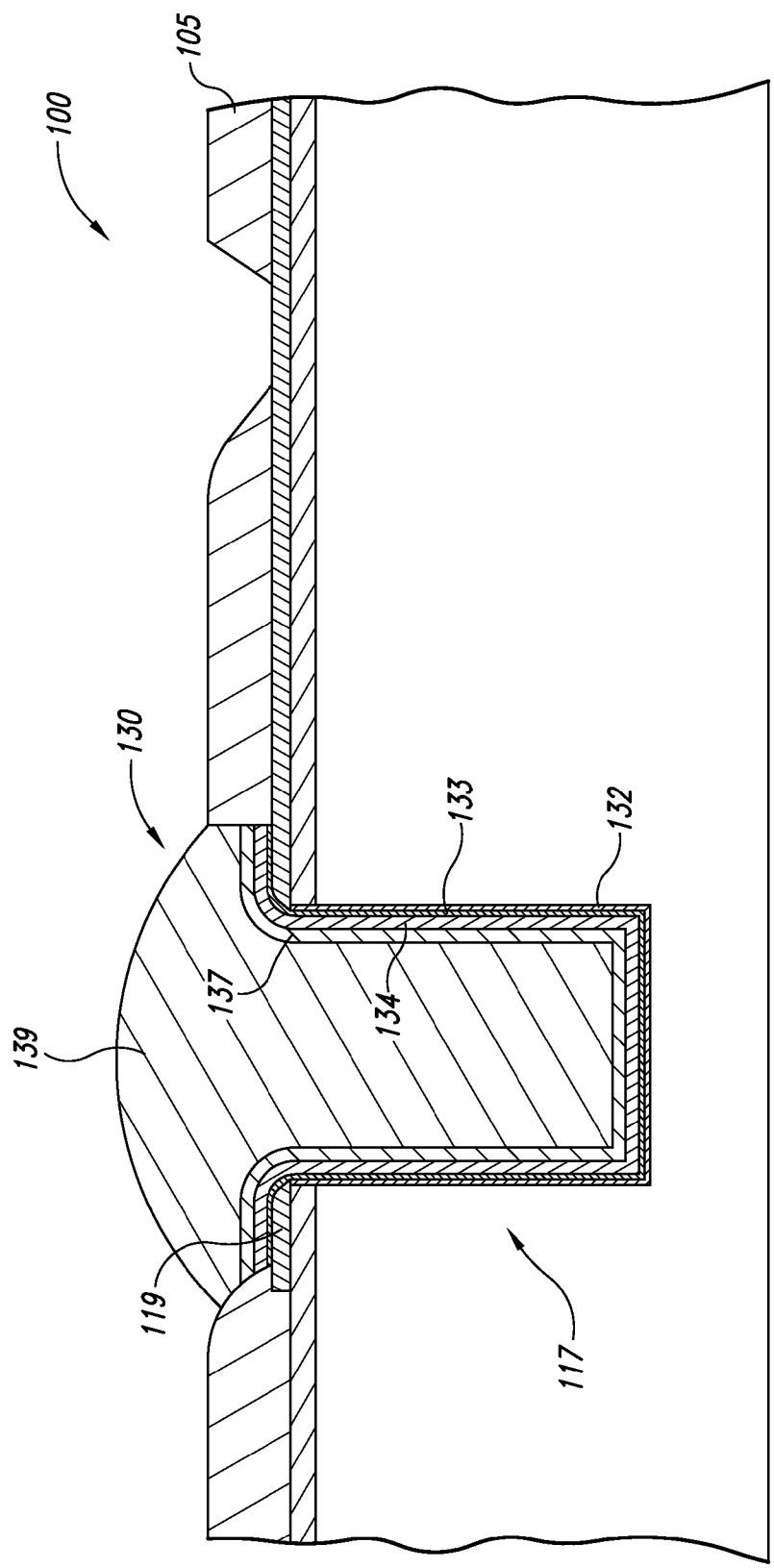
Figure 3C:
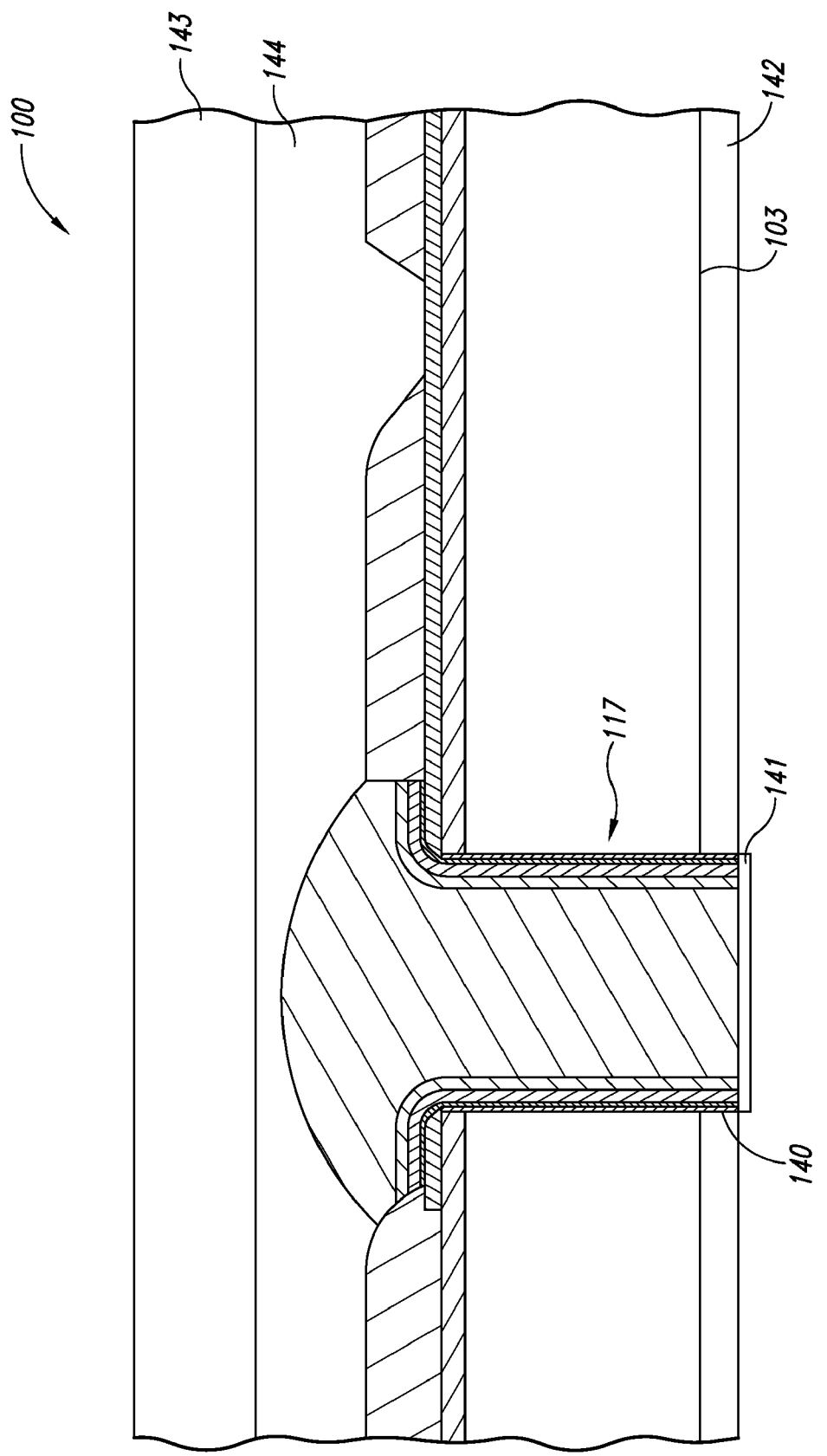

FIGS. 3A-3C illustrate a representative process for forming an interconnect structure and redistribution layer in the first microfeature workpiece 100. Many aspects of this process are well-known and/or generally similar to the processes described above with reference to FIGS. 2A-2L, and accordingly are not discussed in great detail below.

Beginning with FIG. 3A, the first microfeature workpiece 100 can include a substrate 101 that does not include microfeature devices. For example in a particular embodiment, the substrate 101 can include a bare silicon wafer or wafer portion, that is undoped. In other embodiments, the substrate 101 can include various treatments (e.g., doping), but does not include capacitors, memory devices, processor devices, or other operable microfeature devices. Instead, as discussed above with reference to FIG. 1D, the first microfeature workpiece 100 includes the redistribution layer 160. The redistribution layer 160 in turn can include a first dielectric layer 104 disposed on a first surface 102 of the substrate 101, and the conductive structure 162 disposed on the first dielectric layer 104. A second dielectric layer 105 can be disposed over the conductive structure 162 and can then be selectively patterned to expose particular conductive sections. These conductive sections can include the first bond site 119 and the third or RDL bond site 161. A connecting lateral line 163 is located beneath the second conductive layer 105 to connect the first bond site 119 and the third bond site 161. The conductive structure 162 can be formed from aluminum, copper and/or any other suitable conductive material.

Conventional processes that are typically used to form RDLs on microfeature workpieces with operable microfeature devices can be used to form the RDL 160 shown in FIG. 3A. For example, the conductive structure 162 can be formed from aluminum that is applied in a sputtering process, under vacuum. The conductive structure 162 can accordingly rely on the underlying substrate material for physical support. However, as described in greater detail later, these processes may be modified for enhanced efficiency and/or throughput, at least in part because the first microfeature workpiece 100 need not include operable microfeature devices.

FIG. 3B illustrates the first microfeature workpiece 100 after the first interconnect structure 117 has been formed at the first bond site 119. The steps used to form the first interconnect structure 117 are generally similar to those discussed above with reference to the formation of the second interconnect structure 217 shown in FIGS. 2A-2L. Accordingly, the first interconnect structure 117 can include a via 130 having (in sequence) a dielectric layer 132, a barrier layer 133, a seed layer 134, a conductive liner 137 disposed on the seed layer 134, and a fill material 139 that fills the remaining volume of the via 13.

FIG. 3C illustrates the first microfeature workpiece 100 after material has been removed from a second surface 103 to expose a protrusion 140 of the first interconnect structure 117. The first microfeature workpiece can have a thickness of 50-60μ (or more or less) after backgrinding. An optional conductive cap 141 can be positioned on the exposed protrusion 140, and an adhesive layer 142 can be disposed on the second surface 103. Because the first microfeature workpiece 100 is typically very thin, it can be supported by an optional carrier 143 attached to the substrate 101 with a carrier adhesive 144. The first microfeature workpiece 100 is now ready for joining with the second microfeature workpiece 200.

Figure 4:
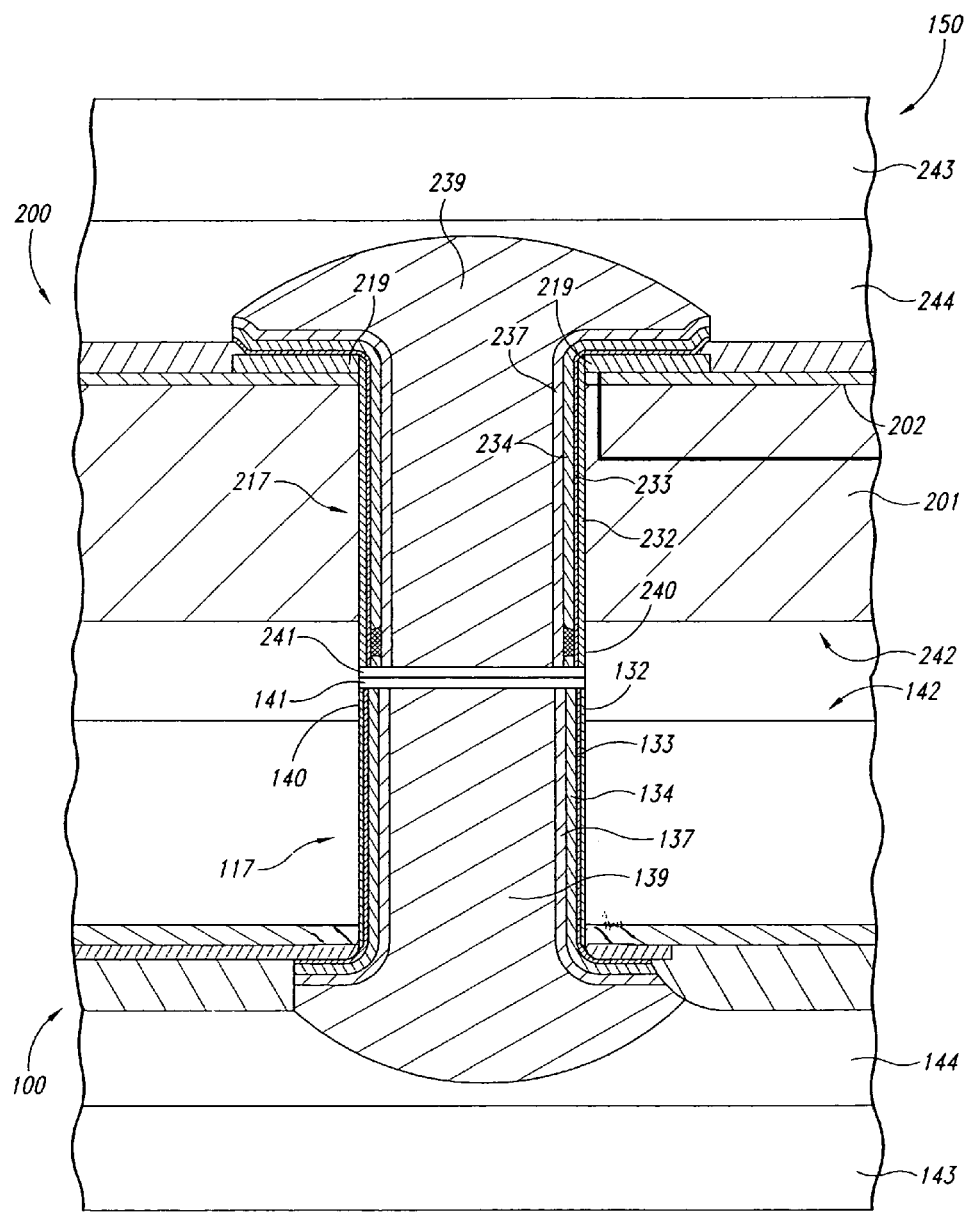
FIG. 4 illustrates a portion of a microfeature assembly that includes the microfeature workpieces shown in FIGS. 2L and 3C, joined in accordance with an embodiment of the invention.

FIG. 4 illustrates a process for joining the first microfeature workpiece 100 and the second microfeature workpiece 200. In the illustrated embodiment, the first microfeature workpiece 100 has been inverted from the orientation shown in FIG. 3C, while the second microfeature workpiece 200 has the same orientation shown in FIG. 2L. The joining process can in some embodiments be completed at the die level (e.g., on singulated portions of the first and second workpieces 100, 200) and in other embodiments, at the wafer level, or at an intermediate level. Performing these processes at the wafer level may have significant cost advantages over performing the processes at the die level. In any of these embodiments, the first and second microfeature workpieces 100, 200 are oriented so that the corresponding substrate adhesives 142, 242 face toward each other, and the corresponding interconnect structure protrusions 140, 240 are aligned with each other. An existing alignment tool can be used to properly align the interconnect structures 117, 217 and the corresponding protrusions 140, 240. Such tools can rely on infrared light that penetrates through the workpieces 100, 200, or individual cameras located proximate to each workpiece 100, 200. Suitable existing bonding and alignment systems are available from, among other sources, Suss MicroTec of Munich, Germany. The microfeature workpieces 100, 200 are then brought toward each other (e.g., stacked) so that the opposing conductive caps 141, 241 contact each other, and the opposing substrate adhesives 142, 242 also contact each other.

The assembly can undergo further processing to complete the electrical and physical connections between the two microfeature workpieces 100, 200. For example, the microfeature workpieces 100, 200 can undergo an elevated temperature and/or elevated pressure process to complete, cure or otherwise improve the connection between the two substrate adhesives 142, 242 and/or between the two caps 141, 241. For example, an elevated temperature process can be used to cure the substrate adhesives 142, 242 and/or establish a cohesive intermetallic bond between the two end caps 141, 241. If the end caps 141, 241 are not included in the assembly, the elevated temperature process can facilitate or improve an intermetallic bond between other constituents of the interconnect structure 117, 217 (e.g., between the fill materials 139, 239, and/or between the conductive liners 137, 237). For example, if the fill materials 139, 239 include solder, the elevated temperature process can include reflowing or melting the solder to join the two interconnect structures 117, 217.

Once the attachment process has been completed, the optional carriers 143, 243 can be removed by releasing the corresponding adhesives 144, 244. The resulting package 150 is generally similar to that shown and discussed above with reference to FIG. 1D. The overall thickness of the resulting package can be on the order of 100μ (or more or less), with specific package thicknesses being dependent upon the individual thicknesses of the first and second microfeature workpieces 100, 200. The package 150 can be attached to external devices (e.g., printed circuit boards). The packages 150 can also be stacked, one upon the other, with the RDL 160 providing signal routing between the stacked packages.

Particular embodiments of the foregoing methods can include positioning a pre-formed redistribution layer as a unit proximate to and spaced apart from a microfeature workpiece having an operable microfeature device, attaching the redistribution layer to the microfeature workpiece, and electrically coupling the redistribution layer to the operable microfeature device. Accordingly, such methods can result in improved processes and microelectronic packages. For example, the redistribution layer or RDL can be formed as a stand-alone unit (e.g., in or on the first microfeature workpiece 100) prior to being attached to the second microfeature workpiece 200. Because the first microfeature workpiece 100 need not include functioning microfeature devices, the processes used to form the RDL need not be constrained by thermal budgets and/or other limitations typically associated with functioning microfeature devices. For example, the RDL can be formed using high temperature processes, which typically take less time and/or produce more consistent results than do lower temperature processes. Many of these processes can be performed on the first microfeature workpiece 100 while the first microfeature workpiece 100 has a significant thickness (e.g., before the back side of the first microfeature workpiece is ground back). As a result, the first microfeature workpiece 100 need not be attached to a carrier for many of the processes described above, and may only be attached to the carrier just prior to being attached to the second microfeature workpiece 200. This arrangement can simplify the process of handling the first microfeature workpiece 100 while the RDL is being formed. Still further, conventional techniques can be used to form the RDL. As a result, the manufacturer need not employ special tooling and/or other costly techniques that are typically associated with forming the RDL directly on the back side of a workpiece containing functioning microelectronic devices.

When forming redistribution layers directly on the back side or second side of the microfeature workpieces having operable devices, the microfeature workpiece is typically supported by a carrier that is attached to the workpiece with an adhesive. The releasable interface between the carrier and the workpiece may include gaps or voids filled with air, which can expand and burst or otherwise damage the workpiece during the vacuum processes that are typically used to form the RDL. However, using techniques generally similar to those described above, the foregoing vacuum process can be applied to the first microfeature workpiece 100 only, and applied at a point when the first microfeature workpiece 100 is thick enough not to require a carrier. Accordingly, the likelihood for causing damage to the die as a result of adhesive voids can be reduced or eliminated.

Conventional redistribution layers formed directly on a microfeature workpiece are typically formed toward the end of the fabrication process for that workpiece. Accordingly, the microfeature workpiece is at or close to its highest dollar value point. If the microfeature device is then damaged during the formation of the RDL, the dollar loss can be significant. Conversely, embodiments of the process described above include forming the RDL or a separate workpiece (e.g., the first workpiece). This arrangement can reduce the likelihood for damaging the product workpiece (e.g., the second workpiece). This arrangement can also increase the overall throughput for the end product because the RDL in the first workpiece can be formed in parallel with the operable microfeature devices in the second workpiece.

Certain aspects of the foregoing processes and resulting devices can be altered in other embodiments. For example, in some embodiments, the adhesive between the first microfeature workpiece 100 and the second microfeature workpiece 200 can be eliminated, and the bond between the first and second interconnect structures 117, 217 can be sufficient to hold the two workpieces together.

From the foregoing, it will be appreciated that specific embodiments of the invention have been described herein for purposes of illustration, but that various modifications may be made without deviating from the invention. For example the end caps described above can be eliminated in some embodiments. The processes used to form the interconnect structures and/or connect the microfeature workpieces can be altered in some embodiments. In other embodiments, the first microfeature workpiece with the RDL can be applied to the first or device side of the second microfeature workpiece. Certain aspects of the invention described in the context of particular embodiments may be combined or eliminated in other embodiments. For example, in some embodiments, the first and second microfeature workpieces can be attached to each other using techniques other than face-to-face adhesive bonding (e.g., by using edge bonding). Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A method for processing a microfeature workpiece system, comprising:
    stacking a substrate having a first surface, a redistribution layer at the first surface, a second surface facing opposite from the first surface, a first conductive via extending entirely through the substrate and electrically connected to the redistribution layer, and no operable microfeature devices, relative to a microfeature workpiece having a first surface, a second surface facing opposite from the first surface of the microfeature workpiece and a die with at least one operable microfeature device positioned between the first and second surfaces of the microfeature workpiece and electrically coupled to a second conductive via extending entirely through the microfeature workpiece, the second surfaces of the substrate and the microfeature workpiece facing toward each other, the redistribution layer of the substrate facing opposite from the first surface of the microfeature workpiece, the first and second conductive vias being laterally aligned; and
    electrically connecting the first and second conductive vias proximate to the second surface of the substrate and second surface of the microfeature workpiece.

2. The method of claim 1, further comprising forming the redistribution layer at the substrate.

3. The method of claim 1, further comprising connecting an external device to the redistribution layer.

4. The method of claim 1 wherein the microfeature workpiece includes a plurality of unsingulated dies as the redistribution layer is attached to the microfeature workpiece.

5. The method of claim 4, further comprising singulating individual dies from the microfeature workpiece with individual portions of the redistribution layer attached to the individual dies.

6. The method of claim 1, further comprising:
    supporting the substrate with a first releasable carrier;
    supporting the microfeature workpiece with a second releasable carrier;
    attaching the substrate and the microfeature workpiece while supporting the substrate with the first carrier and while supporting the microfeature workpiece with the second carrier; and
    releasing the first carrier from the substrate and releasing the second carrier from the microfeature workpiece after the substrate is attached to the microfeature workpiece.

7. The method of claim 1 wherein the method further comprises:
    supporting the substrate with a first releasable carrier;
    supporting the microfeature workpiece with a second releasable carrier;
    while the substrate and the microfeature workpiece are supported by the first and second carriers, connecting exposed end regions of the first and second conductive vias to each other, and adhesively connecting the substrate and the microfeature workpiece to each other; and detaching the first carrier from the substrate and the second carrier from the microfeature workpiece after the substrate and the microfeature workpiece are attached to each other.

8. The method of claim 1 wherein forming the first and second conductive vias includes forming a conductive lining along walls of the vias with a first conductive material, and filling at least part of a remaining volume of the via with a second material.

9. The method of claim 8 wherein the second material is non-conductive.

10. The method of claim 1, further comprising:
releasably attaching a first carrier to the substrate;
releasably attaching a second carrier to the microfeature workpiece;
attaching the microfeature workpiece to the substrate while the second carrier is attached to the microfeature workpiece and the first carrier is attached to the substrate;
removing the first carrier from the substrate after electrically connecting the redistribution layer; and
removing the second carrier from the microfeature workpiece after electrically connecting the redistribution layer.

11. A method for processing a microfeature workpiece system, comprising:
positioning a substrate and a microfeature workpiece proximate to each other, the substrate having a first surface, a second surface facing opposite from the first surface, no operable microfeature devices, and a conductive structure that includes a lateral line, a bond site proximate to the first surface, and a first conductive via extending entirely through the substrate and connected to the lateral line, the microfeature workpiece having a first surface, a second surface facing opposite from the first surface of the microfeature workpiece, a second conductive via extending entirely through the microfeature workpiece, and a die with at least one operable microfeature device positioned between the first and second surfaces of the microfeature workpiece; and
attaching the substrate and the microfeature workpiece to each other with the second surfaces of the substrate and the microfeature workpiece facing toward each other and with the first conductive via of the substrate laterally aligned with and electrically connected to the second conductive via of the microfeature workpiece.

12. The method of claim 11, further comprising removing material from the second surface of the workpiece after forming the second conductive via.

13. The method of claim 11 wherein attaching the substrate and the microfeature workpiece includes attaching the substrate and the microfeature workpiece with an adhesive positioned in contact with the second surfaces of each of the substrate and the microfeature workpieces.

14. A method for processing a microfeature workpiece system, comprising:
forming a redistribution layer in a substrate, the substrate having a first surface, a second surface facing opposite from the first surface, and no operable microfeature devices, the redistribution layer including a bond site accessible from the first surface;
forming a first conductive via extending entirely through the substrate, electrically coupled to the redistribution layer and having a connection region accessible from the second surface of the substrate;
positioning the substrate proximate to a microfeature workpiece, the microfeature workpiece having a first surface, a second surface facing opposite from the first surface of the microfeature workpiece, and a die with at least one operable microfeature device positioned between the first and second surfaces of the microfeature workpiece and electrically coupled to a second conductive via that extends entirely through the microfeature workpiece and is accessible from the second surface of the microfeature workpiece, wherein the first and second conductive vias are laterally aligned; and
electrically connecting the connection region of the first conductive via to the second conductive via while the second surfaces of the substrate and the microfeature workpiece face toward each other.

15. The method of claim 14 wherein forming the first conductive via includes forming the first conductive via in an environment below atmospheric pressure.

16. The method of claim 14, further comprising:
exposing a region of the second conductive via proximate to the second surface of the microfeature workpiece; and
recessing the second surface of the microfeature workpiece away from the exposed region of the second conductive via.

17. The method of claim 16, further comprising disposing an adhesive on a recessed portion of the second surface proximate to the exposed region without covering the exposed region.

18. The method of claim 17, further comprising spinning on the adhesive.

19. The method of claim 16, further comprising:
disposing an adhesive on a recessed portion of the second surface proximate to the exposed region, and over the exposed region; and
removing adhesive material from the exposed region.

20. The method of claim 14 wherein electrically connecting the first and second conductive vias includes at least partially melting material in the first and second conductive vias.

21. The method of claim 14 wherein forming the redistribution layer includes forming a conductive line that is not self-supporting without the substrate.

22. The method of claim 14 wherein forming the redistribution layer includes forming the redistribution layer with a bond pad accessible from the first surface, and wherein the method further comprises attaching an external device to the substrate at the bond pad.

23. The method of claim 21 wherein forming the conductive line includes forming the conductive line in an environment below atmospheric pressure.

24. The method of claim 14 wherein the method further comprises positioning a conductive cap at an exposed region of the second conductive via, proximate to the second surface of the microfeature workpiece.

25. The method of claim 14 wherein forming the second conductive via includes:
forming a via through a bond site and proximate to the first surface of the microfeature workpiece, the via extending through the microfeature workpiece to the second surface of the microfeature workpiece; and
disposing a conductive material in the via.

26. The method of claim 14, further comprising:
aligning an exposed end region of the second conductive via with a corresponding exposed end region of the first conductive via;
attaching the substrate to the microfeature workpiece with the exposed end region of the first conductive via aligned with the exposed end region of the second conductive via; and electrically connecting the end region of the first conductive via to the end region of the second conductive via.

27. The method of claim 1 wherein the first conductive via and the second conductive via are coaxially aligned.

28. The method of claim 11 wherein the first conductive via and the second conductive via are coaxially aligned.

29. The method of claim 14 wherein the first conductive via and the second conductive via are coaxially aligned.

30. The method of claim 1 wherein stacking the substrate includes stacking a silicon wafer.

31. The method of claim 11 wherein positioning the substrate includes positioning a silicon wafer.

32. The method of claim 14 wherein forming the redistribution layer in the substrate includes forming the redistribution layer in a silicon wafer.

* * * * *